United States Patent [19]

Funck et al.

[11] Patent Number: 4,812,895
[45] Date of Patent: Mar. 14, 1989

[54] HYPERFREQUENCY SEMICONDUCTOR DEVICE HAVING EXTERNAL CONNECTIONS ESTABLISHED BY BEAM-LEADS

[75] Inventors: Ronald Funck, Port Marly; Raymond Henry, Fondenay aux Roses, both of France

[73] Assignee: Thomson-csf, Paris, France

[21] Appl. No.: 51,215

[22] Filed: May 13, 1987

Related U.S. Application Data

[63] Continuation of Ser. No. 708,712, Mar. 6, 1985, abandoned.

[30] Foreign Application Priority Data

Mar. 16, 1984 [FR] France ............................. 84 04103

[51] Int. Cl.$^4$ ............................................. H01L 23/48
[52] U.S. Cl. ........................................ 357/69; 357/51; 357/56; 357/58; 357/68
[58] Field of Search ...................... 357/51, 56, 58, 68, 357/69

[56] References Cited

U.S. PATENT DOCUMENTS

| | | | |
|---|---|---|---|
| 3,426,252 | 2/1969 | Lepselter | 357/69 |
| 3,740,523 | 6/1973 | Cohen et al. | 357/69 |
| 3,877,063 | 4/1975 | Abraham et al. | 357/69 |
| 4,409,608 | 10/1983 | Yoder | 357/51 |
| 4,481,487 | 11/1984 | Brehm et al. | 357/51 |

FOREIGN PATENT DOCUMENTS

0136176  10/1979  Japan ................... 357/69

*Primary Examiner*—Edward J. Wojciechowicz
*Attorney, Agent, or Firm*—Roland Plottel

[57] ABSTRACT

A hyperfrequency semiconductor device having external beam-lead connectors is provided with a capacitance connected in series with the inductance produced by said beam-leads, said capacitance being integrated in at least one of the latter and its value being so selected that at operating frequency of the device said capacitance compensates said inductance.

7 Claims, 3 Drawing Sheets

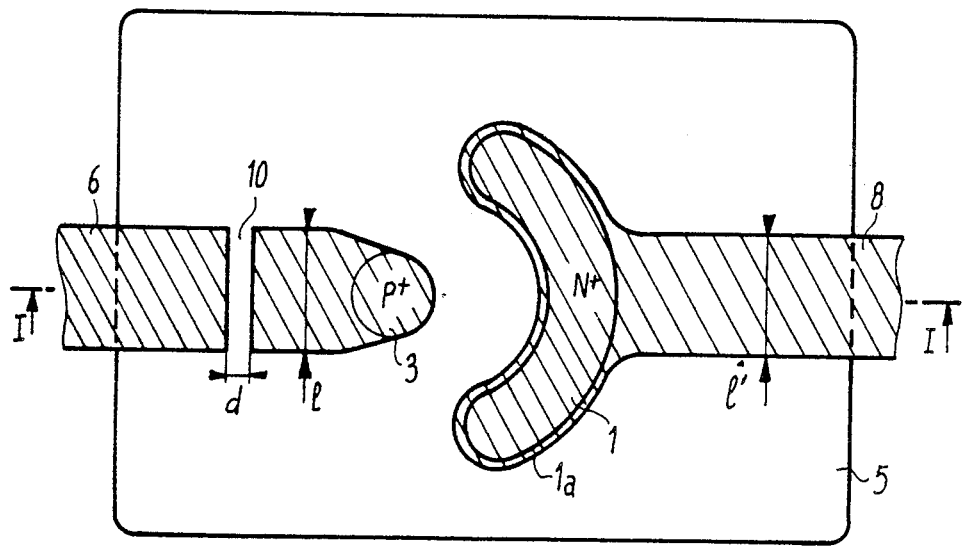
FIG_1 PRIOR ART
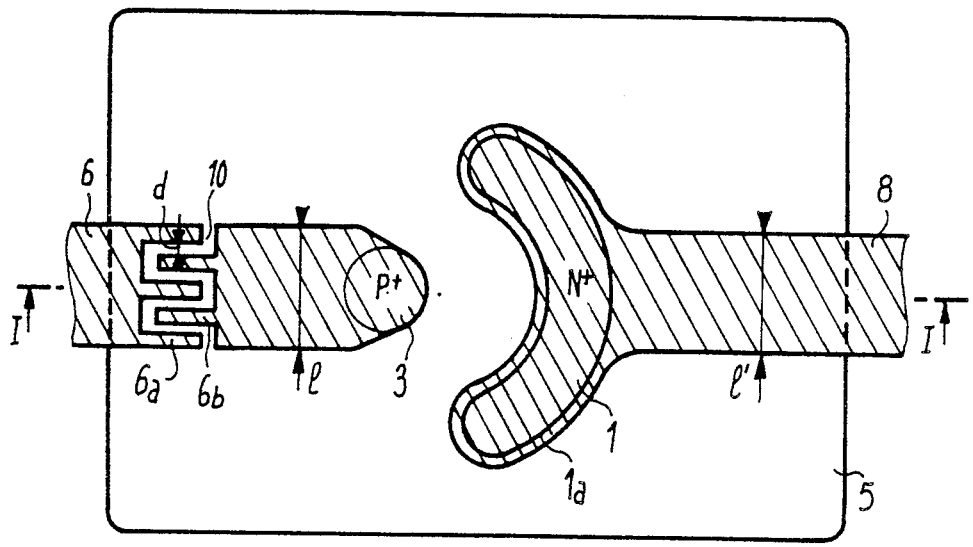
FIG_2 PRIOR ART

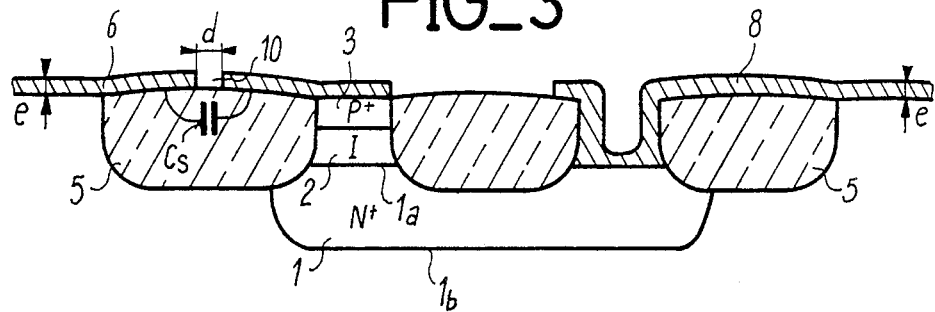
FIG_3
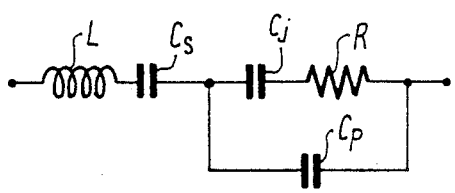
FIG_4-a
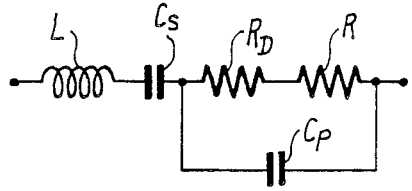
FIG_4-b
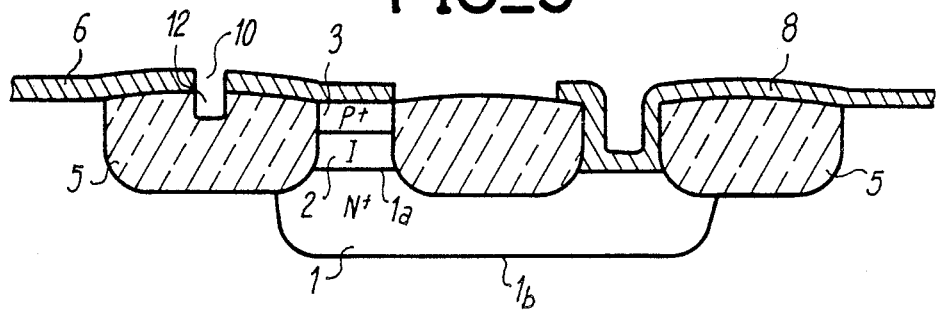
FIG_5
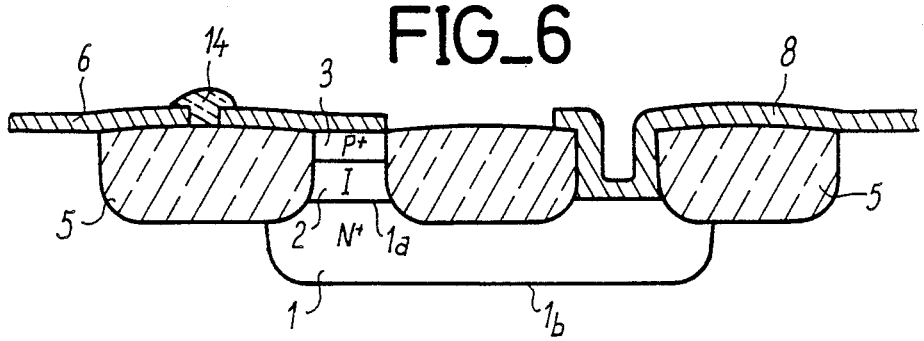
FIG_6

FIG_7
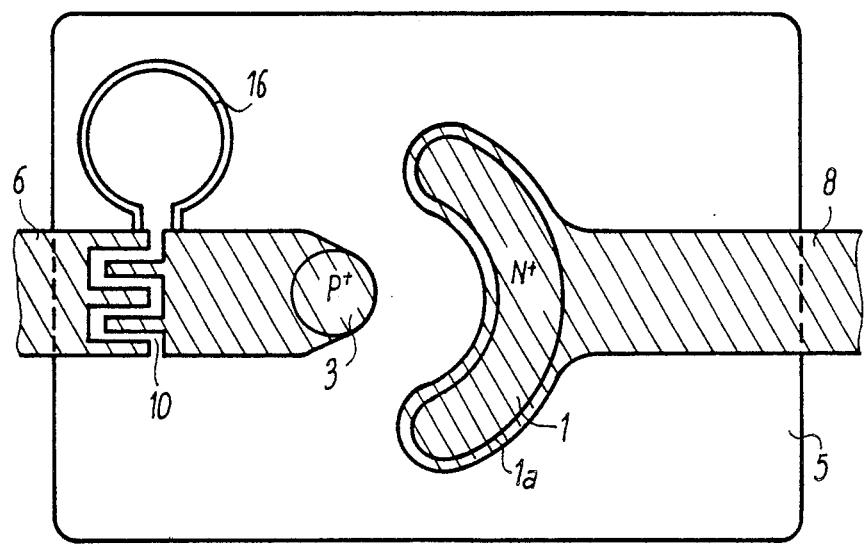
FIG_8-a
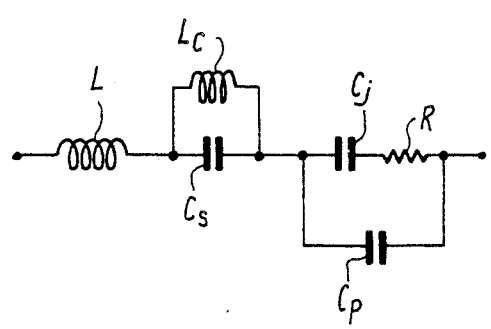
FIG_8-b
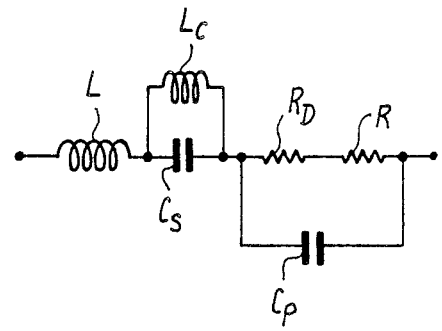

HYPERFREQUENCY SEMICONDUCTOR DEVICE HAVING EXTERNAL CONNECTIONS ESTABLISHED BY BEAM-LEADS

This application is a continuation, of application Ser. No. 708,712, filed 3/6/85, now abandoned.

FIELD OF THE INVENTION

The present invention is related to a hyperfrequency semiconductor device operating in the millimeter wave range, especially at frequencies equal to or higher than 30 GHz, wherein the external or outer connections are established by means of flat metal brackets which are currently named "beam-leads".

Although this should not be construed as a limitation to the invention, the same will be described herein with reference to a diode, since the diode concept is at the root of any more complex semiconductor component, such as the transistors, for example.

BACKGROUND OF THE INVENTION

A hyperfrequency diode structure, such as, for example, the PIN vertical structure diode, is already known, which operates at high frequencies and is provided with external connectors constituted by flat metallic beams affixed to the semiconductor chip in accordance with the so-called "beam-lead" technology. Such PIN diode, which is generally used as a switching or commutation diode connected in parallel or in series in a transmission line, is produced, for example, from an type N+ doped semiconductor substrate on which two mutually superimposed layers are formed by epitaxy, one of said layers, called "I layer", being made of a material having the highest possible resistivity, while the other layer is of the P+ type. A chemical attack (etching) is carried out, starting from the epitaxial layers and extending into the substrate up to a given depth, so as to create a cradle having, for example, a rectangular external contour, under which subsists a certain thickness of substrate material. This cradle is formed so as to delimit two semiconductor islets connected to each other by the substrate, one of said islets having, for example, a circular shape, while the other islet may be, for example, crescent-shaped, the circular islet being located opposite to the crescent-shaped one and at the center of the concave side thereof. The cradle is filled with dielectric material, such as glass, for example, and the P+ and I layers of the crescent-shaped islet are then eliminated by chemical attack. An anode contact is established by a first metallic beam which rests on the P+ layer of the islet and on the glass, and terminates in a cantilever fashion, while a cathode contact is established by a second metallic beam resting on the N+ substrate and being adapted to the crescent-shaped configuration thereof so as to define an ohmic contact, said second beam resting also on the glass and being terminated in a cantilever fashion.

Furthermore, with a view to being enabled to use such diode connected in parallel in a broad-band switching or commutation circuit, it is current practice, on the one hand, to endeavour to obtain zero impedance, or substantially zero impedance of the diode in direct diode polarity (or polarization) conditions, so as to achieve high isolation and, on the other hand, to endeavour to obtain a low capacitance in reversed polarity conditions, so as to be able to adapt the impedance of the diode to that of the environing hyperfrequency circuit; similarly, in the case of series connection of the diode in the commutation circuit, it is endeavoured to have substantially zero impedance in reversed polarity conditions and a low capacity in direct polarity conditions.

Now, it is well known that at the operating frequency of the diode the metallic beams introduce a parasitic inductance connected in series with the diode, independently of the direct or reverse polarity (or polarization) conditions of the latter. At high frequencies, i.e. from about 30 GHz upward, the impedance of said inductance reaches an ever increasing value, for instance 25 to 50 Ohms at 95 GHz, thus causing the impedance of the diode to increase considerably, which is contrary to the aim to be achieved. Thus such inductance has undesirable effects at elevated operating frequencies, and its presence renders the commutating or switching diode unsuitable, since it no longer exerts its function of isolating the hyperfrequency signals. It thus becomes necessary, when operating at high frequencies, to compensate the series inductance of the diode.

This technical problem related to the excessively high inductance of the metallic beams under high frequency conditions also arises with respect to a Schottky beam-lead diode which presents a structure identical to that of the above described PIN diode, but comprises a metal/semiconductor junction and is used as a detecting and mixing diode, wherefrom results the necessity of compensating the said inductance.

SUMMARY DEFINITION OF THE INVENTION

The present invention is aimed at improving this above described type of hyperfrequency diode operating in the millimeter wave range, by associating to the diode an element allowing to nullify the inductance of the beams, or at least to approach such condition as closely as possible.

With this object in view, the fundamental principle of the invention consists in providing a capacitance connected in series with the inductance and integrated in at least one of the two beams of the diode, said capacitance being selected so as to provide, at operating frequency, a series resonance with the inductance of the beams. Thus, according to the invention the compensation of the inductance by the capacitance is achieved on the component itself.

More particularly, it is a main object of the invention to provide a hyperfrequency semiconductor device comprising a semiconductor chip on which at least two external connections constituted by metallic beams are affixed flat, said semiconductor chip including at least two layers carried by a substrate, and a cradle filled with a dielectric material forming a frame which surrounds said semiconductor chip and on which said metallic beams rest flat, said beams terminating in a cantilever fashion and introducing, at the operating frequency, a parasitic inductance in series with said semiconductor chip, wherein at least one of said metallic beams has a slot extending over its entire width and its entire thickness in the zone of the dielectric material carrying said beam, so as to produce a capacitance in series with said inductance introduced by the beams, and wherein said slot has dimensions such that the capacitance produced constitutes a series resonance with the inductance of said beams at the operating frequency, whereby said capacitance compensates said inductance of said beams.

According to another feature of the invention said slot has either a rectangular shape, or the shape of a meandering line.

Others features, objects and advantages of the invention will become more clearly apparent from the following description which is given with reference to the appended drawing and by way of illustration, but not of limitation.

BRIEF DESCRIPTION OF THE DRAWING

In the drawing:

FIG. 1 is a plan view from above showing an embodiment of a PIN diode according to the present invention;

FIG. 2 is a plan view showing a variant of the PIN diode according to the invention;

FIG. 3 is a sectional view taken along the line I—I of FIGS. 1 or 2;

FIGS. 4a and 4b show equivalent diagrams of the diode of FIG. 3 in the reversed polarity (or polarization) state and in the direct polarity (or polarization) state;

FIG. 5 is a view similar to that of FIG. 3, illustrating one possibility of adjusting the capacitance;

FIG. 6 is a view similar to that of FIG. 3, illustrating another possibility of adjusting the capacity;

FIG. 7 is a view similar to that of FIG. 2, showing the polarization connection of the diode;

FIGS. 8a and 8b are equivalent diagrams of the diode according to FIG. 7 in the reversed and the direct polarization state.

In the different figures, identical reference signs designate similar elements which serve identical purposes and yield identical results.

DETAILED DESCRIPTION OF PREFERRED EMBODIMENTS

The invention will now be explained on the base of a vertical structure silicon PIN diode comprising external connections of the beam-lead type, said diode being adapted to operate in the millimeter wave range, for example at 95 GHz. This diode is designed mainly to be used as a commutation or switching component connected in parallel or in series in a transmission line. Said PIN diode in the finished state as shown in plan view in FIGS. 1 and 2, and in cross-sectional view in FIG. 3 comprises a doped silicon substrate 1, e.g. of the N+ type, having a thickness of 25 microns, for example, and presenting two opposed parallel faces called front or upper face 1a, and rear or lower face 1b, respectively. The front face of said substrate is partially covered with two mutually superimposed semiconductor layers that form a mesa on the substrate one of which, designated by reference numeral 2 and called "I layer", is made of silicon and has the highest possible resistivity, while the other layer 3 is made of P+ type doped silicon. The unit formed by substrate 1 and the tow layers 2 and 3 thus constitute the diode properly speaking, the substrate 1 offering, on the one hand, a mechanical support and forming, on the other hand, the cathode contact layer, while layer 3 constitutes the anode contact layer.

The diode is delimited by a deep cradle 5 forming a frame, e.g. of rectangular shape (FIGS. 1 or 2), which surrounds the semiconductor chip and extends in the substrate to a determined depth, e.g. 10 microns, so as to allow a certain thickness of the latter to subsist, e.g. 15 microns, between the rear face 1b of said substrate and the bottom of the cradle.

Furthermore, cradle 5 is arranged so as to delimit the diode proper in the form of an islet, e.g. of circular shape (FIGS. 1 or 2) or square shape, and that portion of the front face of the substrate which is not covered, said portion defining e.g. a crescent-shaped configuration.

Cradle 5 is filled with a dielectric material having satisfactory mechanical properties, such as molten glass. Once the cradle has been filled with glass, the latter presents a slightly bulged surface.

A first contact, or anode contact, is established by a first metallic beam 6 having a width 1 of about 100 microns, for example, which rests flatly on the P+ layer of the diode and on the glass cradle surface 5, while terminating in a cantilever fashion. Said anode beam-lead 6 is constituted, for example, by successive deposits of platinum, titanium, platinum and gold. By way of example, the thickness e of anode beam 6 (FIG. 3) equals about 1 micron.

A second ohmic contact, or cathode contact, is established by a second metallic beam 8 resting flat on the front face 1a of the substrate and assuming the crescent-shaped configuration thereof (FIGS. 1 or 2), so as to constitute the ohmic contact, said beam 8 also resting on glass cradle 5, beyond which it terminates in a cantilever fashion. As in the case of the anode beam-lead, cathode beam-lead 8, which has a width l' and the same thickness e, is constituted by the same succession of deposits of platinum, titanium, platinum and gold.

As is well known, the equivalent diagram of the PIN diode described herein-above is constituted, in reverse polarization, as shown in FIG. 4a, by an inductance L introduced by the anode and cathode beams and connected in series to the junction capacitance $C_J$ and the loss resistance R introduced by the substrate, and by the parasitic capacitance $C_p$ between the beams connected in parallel to $C_j$ and R. Similarly, in the direct polarization state, as shown in FIG. 4b, the inductance L is connected in series with the resistance $R_D$ introduced by the so-called I zone and the loss resistance R, while the parasitic capacitance $C_p$ is in series with $R_D$ and R.

According to the invention the high inductance L of the anode and cathode beams 6 and 8 at the high operating frequency of the diode is compensated by a series capacitance integrated one beam-lead or both beam-leads.

The capacitance is obtained by providing, for example, in anode beam 6, a slot 10 extending through the entire thickness e (FIG. 3) and over the entire width 1 (FIGS. 1 or 2) of said beam. For reasons of commodity said slot is provided substantially in the middle of glass cradle 5 which supports beam 6. Thus said capacitance, which is schematically indicated at $C_S$ in FIG. 3, comprises a first and a second armature constituted by the split or interrupted beam 6, while glass cradle 5 constitutes the dielectric medium.

It will be noted that the capacitance may also be integrated in the cathode beam, or in both the anode beam and the cathode beam without departing from the spirit of the invention.

From the technological point of view this capacitance is established during the metallization of the beam, either by photogravure or by a lift-off process on the glass acting as a support and as a dielectric medium.

In order to compensate a given inductance of the beams the capacitance $C_S$ is defined in such a manner that the series resonance is obtained, or at least approached as closely as possible, for the inductance L of the beams at the operating frequency, i.e. so as to obtain $LC_S \omega^2 = 1$. For this purpose the capacitance is produced as a function of the dimensions of slot 10 provided in the beam, especially as a function of its width d and its length.

According to an embodiment shown in FIG. 1, slot 10 is rectilinear and has a width d and a length equal to 1, which are determined in accordance with the capacitance to be obtained.

According to a variant shown in FIG. 2, slot 2 is in the form of a meandering line, thus defining parallel metallic fingers 6a, 6b . . . which are mutually engaged and may have, for example, the same length, the number of such fingers and the distance between them being determined in accordance with the capacitance to be obtained.

FIGS. 4a and 4b show the capacitance $C_S$ thus produced, connected in series with the inductance L, wherein $LC_S \omega^2 = 1$, which is introduced into the equivalent diagram of the diode in the reversed polarization state (FIG. 4a) and in the direct polarization stage (FIG. 4b).

In FIG. 5, which shows the PIN diode structure described here-in-before with reference to FIG. 3, it can be seen that when the capacitance $C_S$ produced is too high to effect the compensation of the inductance of the beams, said capacitance is adjusted, i.e. decreased by providing a hole 12 of a predetermined depth in glass cradle 5 by means of chemical attack (etching) through slot 10.

On the contrary, FIG. 6 illustrates the case of too low a value of the capacitance produced ($C_S$); said capacitance can be increased by depositing a drop 14 of dielectric material onto anode beam 6, thus filling its slot 10. The amount of dielectric material is such that it adjusts capacitance $D_S$ to the value ensuring compensation of the inductance of the beams. Preferably the dielectric material used is a polymerizable material, e.g. loaded polyimide.

It will be noted that where the hole bored into glass cradle 5 has too great a depth, which would lead to too low a capacity, it is still possible to adjust the latter by increasing it by means of a convenient dielectric material deposited in the hole of said glass cradle.

FIG. 7 which represents the structure of the PIN diode of FIG. 2 shows at 16 the polarization connection of the diode, which is constituted, for example, by a thin wire the ends of which are fixed, e.g. by application of heat and pressure, onto anode beam 6, on either side of slot 10. Thus said thin wire acts as a so-called shock inductance, i.e. high impedance inductance, connected in parallel to the capacitance integrated in the anode beam, the value of said inductance being substantially proportional to the length of the wire.

In the millimeter wave range, diode polarization connection 16 is preferably constituted by a metallized strip obtained either by photogravure or by a lift-off process on glass cradle 5, such metallization acting also as a shock inductance connected in parallel to the capacitance.

It will be noted that this inductance constituted by connection 16 may also be provided in the structure of a PIN diode such as the one represented in FIG. 1.

FIGS. 8a and 8b show the equivalent diagram for reverse polarization and direct polarization, respectively, in the presence of shock inductance $L_C$, which has a given value substantially higher than that of inductance L, for example ten times higher, and which is connected in parallel to the capacitance $C_S$ integrated in the beam.

It will be understood that, although the description herein-above relates to a PIN diode the base material of which is silicon, the invention is applicable to any other type of diode, e.g. to a Schottky diode wherein layer 3 is made of a convenient metal, and is also applicable to a base material of Groups III-V, such as GaAs for example.

Furthermore, although the invention has been described herein with reference to a diode, it is obviously applicable, too, to a more sophisticated device, such as a transistor having three external connections in the form of flat beam-leads.

The invention is not limited to the embodiments shown and described herein; many modifications and variants can be envisaged by those skilled in the art, without departing from the spirit and scope of the invention as defined in the appended claims.

We claim:

1. A semiconductive device designed for operation at frequencies of millimeter wavelength comprising
   a semiconductive chip having a substrate portion of one conductivity type and relatively low resistivity, and a mesa portion supported on a limited region of the substrate portion and including a surface portion of conductivity type opposite that of the substrate and of relatively low resistivity and an intermediate portion between said surface portion and substrate portion and of relatively high resistivity;
   dielectric means forming a cradle for the chip and having a top surface substantially coplanar with the top surface of the mesa portion of the chip, surrounding and contacting the sidewalls of the mesa portion of the chip, and including an opening for exposing a portion of the top surface of the substrate portion of the chip;
   and a pair of beam leads supported on the top surface of the dielectric means of which one overlies the top surface of the mesa portion of the chip for making electrical connection thereto and the other extends through the opening in the dielectric means for overlying the exposed portion of the top surface of the substrate portion of the chip,
   at least one of the two beam leads including means for forming a capacitance for series resonating with the inductance of the beams leads at the frequency designed for operation.

2. A semiconductive device in accordance with claim 1 in which the means forming the capacitance comprises a slot in the one beam lead transverse to its length for severing the beam lead, the slot being essentially free of conducting material, and further includes means separate from the slot for maintaining d-c continuity across the slot.

3. A semiconductive device in accordance with claim 2 in which the slot has a meandering line shape.

4. A semiconductor device in accordance with claim 2 in which the slot is filled with a dielectric solid.

5. A semiconductor device in accordance with claim 3 in which the dielectric solid is loaded polyimide.

6. A semiconductive device in accordance with claim 1 in which said mesa portion of the chip is circular in cross section and the other beam lead is crescent-shaped, the mesa portion being at substantially the center of the concave face of the crescent.

7. A semiconductive device in accordance with claim 2 in which said means for maintaining d-c continuity is a conductive loop forming an inductance in parallel with the capacitance of the slot.

* * * * *